US005523689A

United States Patent [19]
Oppelt et al.

[11] Patent Number: 5,523,689
[45] Date of Patent: Jun. 4, 1996

[54] RADIO-FREQUENCY ANTENNA FOR A MAGNETIC RESONANCE APPARATUS

[75] Inventors: Ralph Oppelt, Uttenreuth; Wilhelm Duerr, Erlangen, both of Germany

[73] Assignee: Siemens Aktiengesellschaft, Munich, Germany

[21] Appl. No.: 420,213

[22] Filed: Apr. 11, 1995

[30] Foreign Application Priority Data

Apr. 25, 1994 [DE] Germany .......................... 44 14 372.9

[51] Int. Cl.⁶ .................................................. G01V 3/00
[52] U.S. Cl. .................................... 324/318; 324/322
[58] Field of Search ...................... 324/318, 322

[56] References Cited

U.S. PATENT DOCUMENTS 4,506,224  3/1985  Krause .
5,107,217  4/1992  Duerr .

*Primary Examiner*—Walter E. Snow
*Assistant Examiner*—Mack Haynes
*Attorney, Agent, or Firm*—Hill, Steadman & Simpson

[57] ABSTRACT

A radio-frequency antenna for a magnetic resonance apparatus has an antenna conductor in the form of a ribbon conductor. The ribbon antenna conductor has interconnects arranged side-by-side. Neighboring interconnects are connected to one another via bridges that conduct radio-frequency currents.

3 Claims, 1 Drawing Sheet

RADIO-FREQUENCY ANTENNA FOR A MAGNETIC RESONANCE APPARATUS

BACKGROUND OF THE INVENTION

1. Field of the Invention

The present invention is directed to a radio frequency antenna for a magnetic resonance apparatus having an antenna conductor implemented in the form of a ribbon/conductor.

2. Description of the Prior Art

U.S. Pat. No. 5,107,217 discloses a radio-frequency antenna of the type generally described above. In the case of a whole body antenna, antenna conductors formed by ribbon conductors are arranged in the axial direction of the antenna within a cylindrical radio-frequency shield. The use of ribbon conductors for such an antenna has some advantages compared to the use of rod-shaped antenna conductors. First, the antenna filling factor is thereby improved, resulting in an improved signal-to-noise ratio. Second, the radio-frequency field in the examination volume is more uniform. Given fast pulse sequences as required, for example, in echo planar imaging (EPI), eddy currents in the low-frequency range are generated in the antenna by the rapidly changing gradient fields. As a result, the shape of the gradient pulse changes and, the known antenna conductors (regardless of whether they are ribbon or rod shaped) are heated by the eddy currents. The power consumption for the gradient power supply thus increases.

SUMMARY OF THE INVENTION

An object of the present invention is to improve the radio-frequency antenna of the type described above such that it can be utilized without disadvantages even given fast pulse sequences.

This object is achieved in an antenna having conductors in the form of ribbon conductors, with each conductor having electrical interconnects arranged side-by-side, with neighboring interconnects being connected to one another by bridges that conduct radio-frequency currents. Due to the slotted structure, the eddy currents generated by the gradient fields are greatly reduced in the antenna conductor. In order to permit the radio-frequency current to form on the ribbon conductor, which is now slotted, in the same way as in the case of a non-slotted antenna conductor, the bridges are preferably arranged at locations at which radio-frequency currents attempt to flow from one interconnect to another. The radio-frequency behavior is thus not substantially degraded.

In an embodiment, some of the bridges are formed of capacitive elements. Low-frequency eddy currents between the interconnects, are thus completely suppressed. The spacing of the capacitative elements that respectively bridge an insulating slot is selected such that no ring currents can be induced over a plurality of interconnects, the resonance of these ring currents lying in the range of the operating or working frequency of the radio-frequency antenna.

In another embodiment, the bridges are preferably arranged in the end region of the antenna conductor. Despite low values of capacitance of, typically, a few nanofarads of the individual capacitive elements, low radio-frequency resistances can be realized in the region in which large high-frequency currents attempt to flow between the interconnects.

DESCRIPTION OF THE PREFERRED EMBODIMENTS

Figure 1:
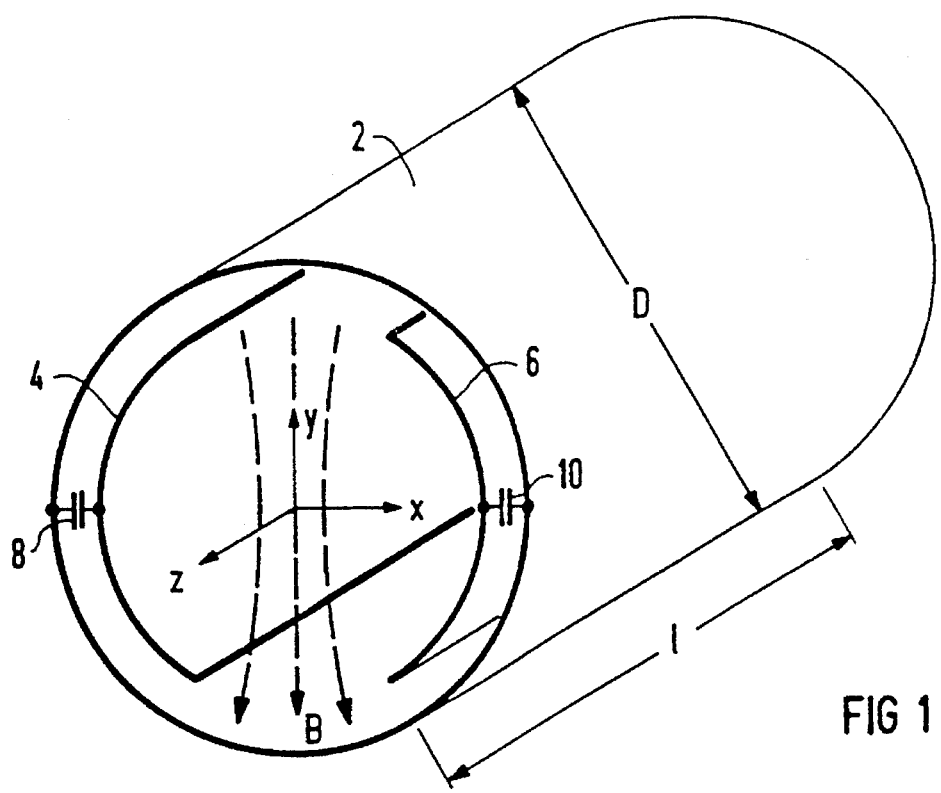
FIG. 1 is a perspective view of a whole body antenna for a magnetic resonance apparatus having feed lines formed by ribbon conductors constructed in accordance with the principles of the present invention.

The radio-frequency antenna schematically shown in FIG. 1 is fashioned as a whole body antenna and has a radio-frequency shield 2 formed by a cylindrical jacket whose longitudinal axis is aligned in the z-direction of a Cartesian x-y-z-coordinate system. The radio-frequency shield 2 has a length l of, for example, 200 cm and a diameter D of, for example, 70 cm. It can thus accept a patient to be ,examined. The radio-frequency shield 2 can, for example, be composed of copper or at least partially of silver-plated copper. Alternatively, the radio-frequency shield 2 can be composed of metallized plastic parts. The radio-frequency shield 2 should allow the gradient fields in the low-frequency range generated outside the shield 2 to pass and should block the signals in the radio-frequency range (and higher) generated by the antenna within the radio-frequency shield 2. In addition, the radio-frequency shield 2 reduces disturbances during the reception of extremely weak magnetic resonance signals. Such a frequency behavior is essentially generated by a slotting of the radio-frequency shield 2.

A radio-frequency antenna arranged in the inside of the radio-frequency shield 2 has two antenna conductors 4 and 6 formed by ribbons of copper or silver-plated copper that are applied on a plastic carrier. The ribbon conductors 4 and 6 extend in the longitudinal direction (z-direction) within the radio-frequency shield 2. The ribbon antenna conductors 4 and 6 are arranged diametrically opposite one another at a spacing of a few centimeters from the inside wall of the radio-frequency shield 2, and are matched to the curvature of the radio-frequency shield 2. The ribbon antenna conductors 4 and 6 generate an essentially uniform magnetic field B in the environment of the cylindrical axis, as indicated by dashed arrows. The ribbon antenna conductors 4 and 6 are each connected to the radio-frequency shield 2 at their ends via respective shortening capacitors 8 and 10, whereby the radio-frequency shield 2 serves as the return conductor of the antenna conductors 4 and 6. Only the shortening capacitors 8 and 10 of the front side are shown in FIG. 1. The signal connection to the radio-frequency antenna can ensue, for example, parallel to the shortening capacitors 8 and 10.

Figure 2:
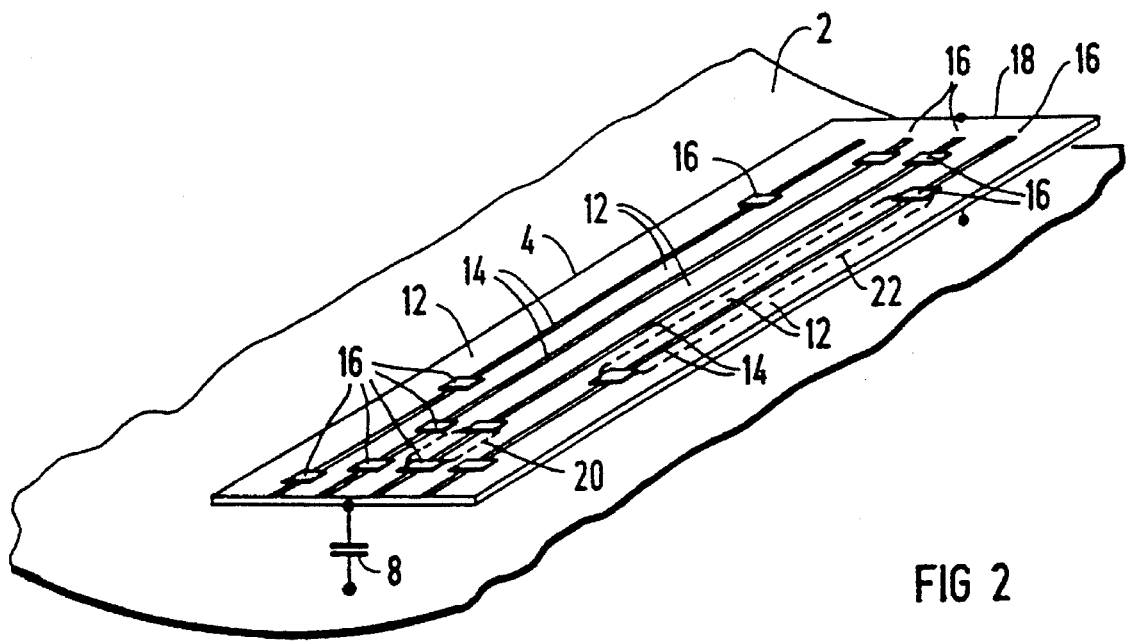
FIG. 2 shows a ribbon conductor for the antenna of FIG. 1 in detail.

In order to permit the radio-frequency antenna also to be utilized in fast image sequences such as, for example, echo planar imaging (EPI) without disadvantages, the two antenna conductors 4 and 6 are slotted in the longitudinal direction (i.e., the z-direction, in FIG. 1), so that electrical interconnects 12 arranged side-by-side arise as shown in greater detail in FIG. 2. The width of the interconnects 12 is selected such that the eddy currents generated by the gradient fields can be left out of consideration. The slots 14, should be as narrow as possible so that the high-frequency fields cannot pass through them. As an example, the antenna conductor 4 shown in FIG. 2 is flat and is divided into five interconnects 12 of equal width. Neighboring interconnects 12 are connected to one another via bridges 16 that conduct radio-frequency currents. The bridges 16 are arranged at locations where the radio-frequency antenna currents attempt to flow from one interconnect 12 to the neighboring interconnect. The bridges 16 can also be realized by direct electrical connections, or by capacitors that, are for example, soldered to the interconnects 12.

The bridges 16 present at one end 18 of the antenna conductor 4 are formed by terminating the slots 14 short of the edge of the conductor 4, so that the slots 14 do not extend continuously to that edge of the antenna conductor 4. Just like the interconnects 12, these end bridges 16 are composed of copper or of silver-plated copper. When the antenna conductors 4 and 6 are implemented as printed circuits, the bridges 16 can already be taken into consideration in the printed circuit board layout like the interconnects 12. The remaining bridges 16 are implemented as capacitors so that the low-frequency eddy currents generated by the gradient coil system do not encounter any closed circuits between the individual interconnects 12. The spacing of the bridges 16 is selected such that no ring currents can flow between a plurality of interconnects 12, the resonant frequency of these ring currents lying in the range of the operating frequency of the magnetic resonance apparatus. As a consequence of the low inductances in the circuit, thus, the resonant frequency of the first circular current circuit 20 indicated by the dashed line lies substantially above the operating frequency. By contrast the resonant frequency of the second circular current circuit indicated by the dashed line 22 lies substantially below the operating frequency because of the higher inductance of the circuit. The resonant frequency of the circular currents circuits 20 and 22 can likewise be influenced by the capacitance value of the bridges 16.

Although modifications and changes may be suggested by those skilled in the art, it is the intention of the inventors to embody within the patent warranted hereon all changes and modifications as reasonably and properly come within the scope of their contribution to the art.

We claim as our invention:

1. A radio-frequency antenna for a magnetic resonance apparatus, said radio-frequency antenna comprising:

a radio-frequency shield;

a ribbon-shaped electrical conductor disposed inside said radio-frequency shield and having a plurality of substantially parallel slots therein forming a plurality of substantially parallel side-by-side electrical interconnects, said radio-frequency shield comprising a return conductor for said ribbon-shaped electrical conductor; and a plurality of electrically conducting bridges, which conduct radio-frequency currents, connected between neighboring ones of said electrical interconnects, at least some of said of said bridges in said plurality of bridges being capacitive elements.

2. A radio-frequency antenna as claimed in claim 1 wherein said antenna conductor has an end region, and wherein said bridges are disposed at said end region of said antenna conductor.

3. A radio frequency antenna as claimed in claim 1 wherein said magnetic resonance apparatus has an operating frequency, and wherein said bridges formed by capacitive elements have a spacing relative to other bridges and a capacitance which, in combination, do not form any resonant circuit having a resonant frequency equal to said operating frequency.

\* \* \* \* \*